United States Patent
Salim et al.

(10) Patent No.: US 11,754,979 B2
(45) Date of Patent: Sep. 12, 2023

(54) ATOMIC CLOCK WITH ATOM-TRAP ENHANCED OSCILLATOR REGULATION

(71) Applicant: ColdQuanta, Inc., Boulder, CO (US)

(72) Inventors: Evan Salim, Lafayette, CO (US); Judith Olson, Northglenn, CO (US); Andrew Kortyna, Boulder, CO (US); Dina Genkina, Hyattsville, MD (US); Flavio Cruz, Superior, CO (US)

(73) Assignee: ColdQuanta, Inc., Boulder, CO (US)

( * ) Notice: Subject to any disclaimer, the term of this patent is extended or adjusted under 35 U.S.C. 154(b) by 0 days.

(21) Appl. No.: 17/695,968

(22) Filed: Mar. 16, 2022

(65) Prior Publication Data

US 2022/0390902 A1 Dec. 8, 2022

Related U.S. Application Data

(60) Provisional application No. 63/197,375, filed on Jun. 5, 2021.

(51) Int. Cl.
  *G04F 5/14* (2006.01)
  *H03L 7/26* (2006.01)
  *G01N 21/64* (2006.01)

(52) U.S. Cl.
  CPC ......... *G04F 5/145* (2013.01); *G01N 21/645* (2013.01); *G04F 5/14* (2013.01); *H03L 7/26* (2013.01); *G01N 2021/6471* (2013.01)

(58) Field of Classification Search
  CPC ..................................... G04F 5/145
  USPC ........................................ 331/94.1
  See application file for complete search history.

(56) References Cited

U.S. PATENT DOCUMENTS

| | | |
|---|---|---|
| 4,912,716 A | 3/1990 | Mead |
| 5,548,124 A | 8/1996 | Takeshima |
| 8,780,948 B2 * | 7/2014 | Wilkinson ............... H01S 3/13 372/18 |
| 9,377,351 B2 | 6/2016 | Colvin, Jr. |
| 10,340,658 B1 * | 7/2019 | Boyd .................. H01S 3/10092 |
| 2004/0160155 A1 | 8/2004 | Partlo |
| 2004/0173760 A1 | 9/2004 | Kino |

(Continued)

OTHER PUBLICATIONS

Author Unknown, FM Spectroscopy with Tunable Diode Lasers, Mar. 1, 2022, pp. 1-8.

(Continued)

*Primary Examiner* — Joseph Chang
(74) *Attorney, Agent, or Firm* — Van Pelt, Yi & James LLP; Clifton Leon Anderson

(57) ABSTRACT

A rubidium optical atomic clock uses a modulated 778 nanometer (nm) probe beam and its reflection to excite rubidium 87 atoms, some of which emit 758.8 nm fluorescence as they decay back to the ground state. A spectral filter rejects scatter of the 778 nm probe beams while transmitting the 775.8 nm fluorescence so that the latter can be detected with a high signal-to-noise ratio. Since the spectral filter is only acceptably effective at angles of incidence less than 8° from the perpendicular, the atoms are localized by a magneto-optical trap so that most of the atoms lie within a conical volume defined by the 8° angle so that the resulting fluorescence detection signal has a high signal-to-noise ratio. The fluorescence detection signal can be demodulated to provide an error signal from which desired adjustments to the oscillator frequency can be calculated.

19 Claims, 4 Drawing Sheets

(56) References Cited

U.S. PATENT DOCUMENTS

| | | |
|---|---|---|
| 2005/0214167 A1 | 9/2005 | Archibald |
| 2010/0149073 A1 | 6/2010 | Chaum |
| 2011/0019186 A1 | 1/2011 | Himmelhaus |
| 2013/0324819 A1 | 12/2013 | Colvin, Jr. |
| 2022/0198586 A1 | 6/2022 | Mimassi |

OTHER PUBLICATIONS

Martin et al., Compact Optical Atomic Clock Based on a Two-Photon Transition in Rubidium, Mar. 28, 2019, pp. 1-10.

* cited by examiner

ATOMIC CLOCK WITH ATOM-TRAP ENHANCED OSCILLATOR REGULATION

BACKGROUND

Technologies such as cellular telephones, the Global Positioning System (GPS) satellite receivers, and the electric power grid, rely on the high accuracy of atomic clocks. The current U.S. time standard F2 atomic clock is designed to neither lose nor gain more than a second in 300 million years. The F2 atomic clock, like its predecessor, is a cesium microwave fountain clock. Such fountain atomic clocks are too large, too massive, and too expensive for many applications in which accurate timing is required "on-board". Ongoing development work on a rubidium optical clock promises a portable and economical alternative for such applications.

Clocks and other time-keeping devices use an oscillator to provide vibrations (aka, "tics") at a constant rate to track time. Grandfather clocks and the like (think "Cogsworth" in Disney's animated Beauty and the Beast) use a pendulum and many watches use quartz crystals. The F2 atomic clock uses microwave transitions between ground-state hyperfine levels of a cesium atom. Of particular interest herein, is a rubidium optical clock that uses a 1556 nm diode laser as the oscillator.

The oscillator signal is input to a frequency comb that can provide for a stable clock output as long as the oscillator frequency remains within a target range. To stay within the target range, the oscillator frequency is regulated. To this end, a portion of the ~1556 nm oscillator signal is frequency doubled to yield a modulated ~778.1 nm probe beam. This probe beam is input to a hot vapor of rubidium atoms, causing transitions from a ground state to an excited state. A portion of the excited rubidium atoms emit 420 nm fluorescence, which can be detected. The resulting fluorescence detection signal can be used to generate an error signal. The error signal can be used to compute a frequency adjustment as needed to maintain the oscillator within the target frequency range, thereby ensuring a stable clock output.

One challenge encountered in the rubidium optical clock is that only a small percentage (about 12%) of the excited rubidium atoms contribute to the fluorescence at 420 nm. As a result, the fluorescence detection signal strength can be low, which can lead to a low signal-to-noise ratio. The low signal-to-noise ratio can limit the precision of the frequency adjustments to the diode laser, which can make it more difficult to remain within the target oscillator frequency range. What is needed is a florescence intensity signal with a stronger signal-to-noise ratio so that a more stable oscillator frequency and thus a more stable clock output can be achieved.

DETAILED DESCRIPTION

The present invention provides for enhanced detection of fluorescence from a molecular entity (e.g., atom) vapor where background noise includes wavelengths close to that of the fluorescence. More specifically, an optical (e.g., all-optical or magneto-optical) trap is used to localize molecular entities within a narrow angle required by some spectral filters to effectively distinguish wavelengths near to a wavelength to be detected. In embodiments in which there are no other detectable fluorescence wavelengths, this localization enables fluorescence detection where otherwise there would be none. In embodiments in which there are other readily detectable fluorescence wavelengths, this localization provides for higher signal-to-noise (S/N) detection signals and/or other advantages. In the context of an atomic clock, the higher S/N provides for more effective oscillator regulation and thus a more stable atomic clock output.

Figure 1:
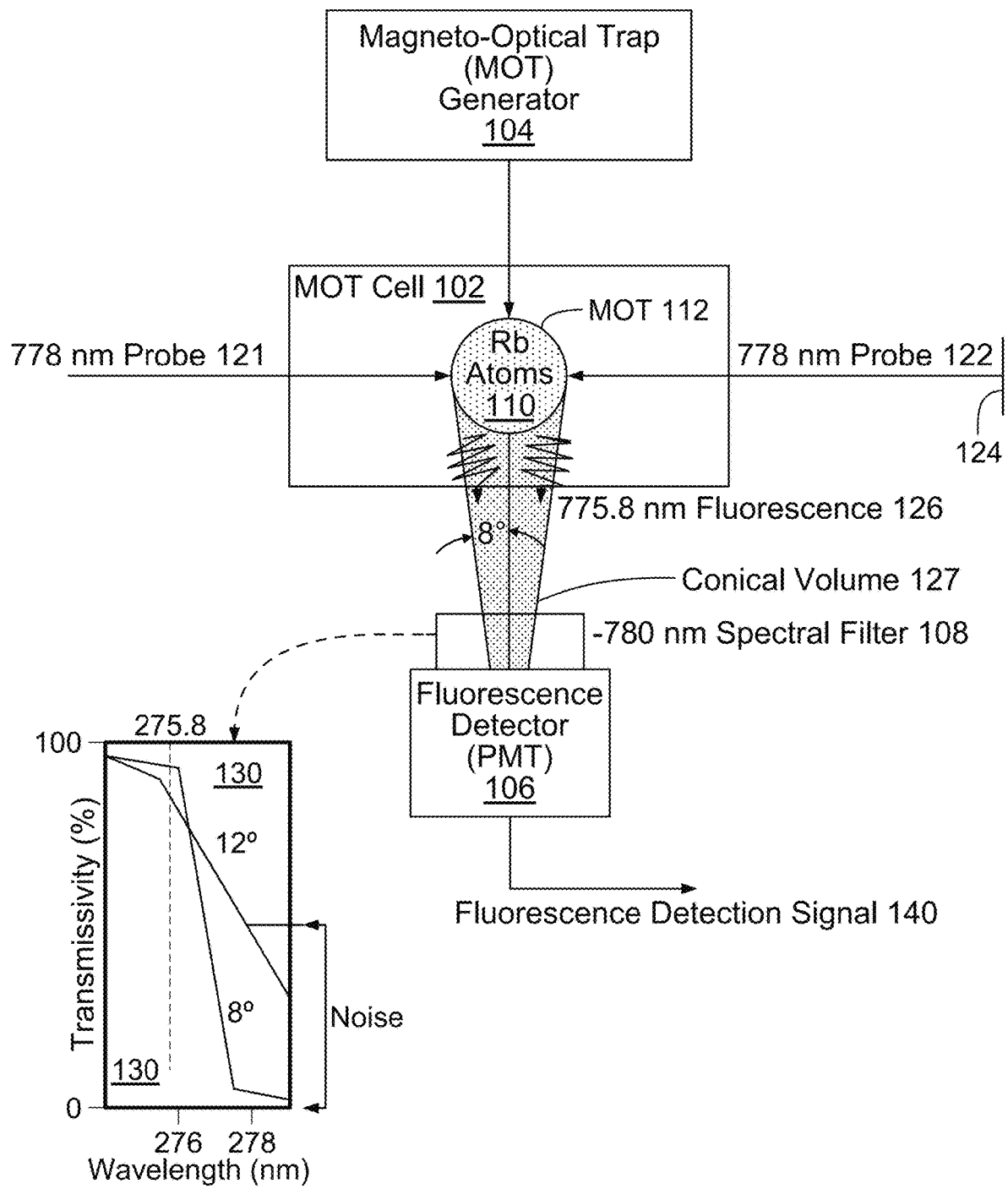
FIG. 1 is a schematic illustration of a fluorescence detection system.

For example, a fluorescence detection system 100, shown in FIG. 1, for an atomic clock includes a magneto-optical trap (MOT) cell 102, a MOT generator 104, a fluorescence detector 106, and a spectral filter 108. Hermetically sealed MOT cell 102 is initially filled with rubidium 87 ($^{87}$Rb) atoms 110. MOT generator 104 cools and traps atoms 110 in a MOT 112 so as to localize them within cell 102. In alternative embodiments, other traps, e.g., all-optical traps, are used to localize $^{87}$Rb atoms, other atoms, or other molecular entities (e.g., polyatomic molecules) to such a subregion of a cell.

Once localized by trap 112, atoms 110 are excited from a ground state to an excited state using a set of one or more probe beams. In the illustrated case, two counter-propagating probe beams 121 and 122 with wavelengths of about 778 nm are used for Doppler-free excitation of the atoms. Probe beam 122 results from a reflection of probe beam 121 off of a cats-eye retro-reflector 124 of fluorescence detection system 100. The percentage of atoms 110 that are excited is highest when the probe beam wavelength is 778.1 nm and is lower to the extent that the probe wavelength deviates from 778.1. In alternative embodiments, a second probe beam is not a reflection of a first probe beam, only a single probe beam is used, or three or more probe beams are used. In the illustrated embodiment, the probe beams have the same wavelength; other embodiments use plural probe beams of different wavelengths.

Once excited, atoms 110 spontaneously decay to their original ground state, emitting fluorescence in the process. Most of the decaying atoms emit fluorescence 126 consisting of photons with wavelengths of 775.8 nm. Fluorescence detector 106 is configured to detect incident 775.8 nm photons. Fluorescence is omnidirectional, so not all emitted photons with wavelength 775.8 nm reach fluorescence detector 106, so signal-to-noise ratio is a concern, especially considering the presence of spectrally near 778 nm background noise resulting from scattering of the probe wavelengths.

Spectral filter 108 is used to reject 778 nm scatter (from the probe beams) while transmitting 775.8 nm fluorescence. A graph 130 of transmissivity vs. wavelength is plotted for angles of incidence of 8° and 12°. These plots show effective rejection of the 778 nm wavelength incident within 8° of perpendicular to spectral filter 108, but significantly less effective rejection near 12°. Thus, at 12° the resulting detection signal can have a substantial noise component due to detection of scatter from probe beams 121 and 122. By using an atom trap to localize fluorescence sources at a small subregion within an 8° conical volume 127, the present invention increases the percentage of 775.8 nm fluorescence transmitted and the percentage of 778 nm scatter blocked by spectral filter 108.

The fluorescence transmitted by spectral filter 108 is detected by fluorescence detector 106. Fluorescence detector 106 is a photomultiplier tube (PMT) with a 5 nanoamp (nA) dark current. This PMT provides a fast temporal response and high electron-multiplying gain. A fluorescence detection signal 140 results from fluorescence photons incident fluorescence detector 106. Fluorescence detector 106 is incorporated into rubidium optical atomic clock 200, shown in FIG. 2.

Figure 2:
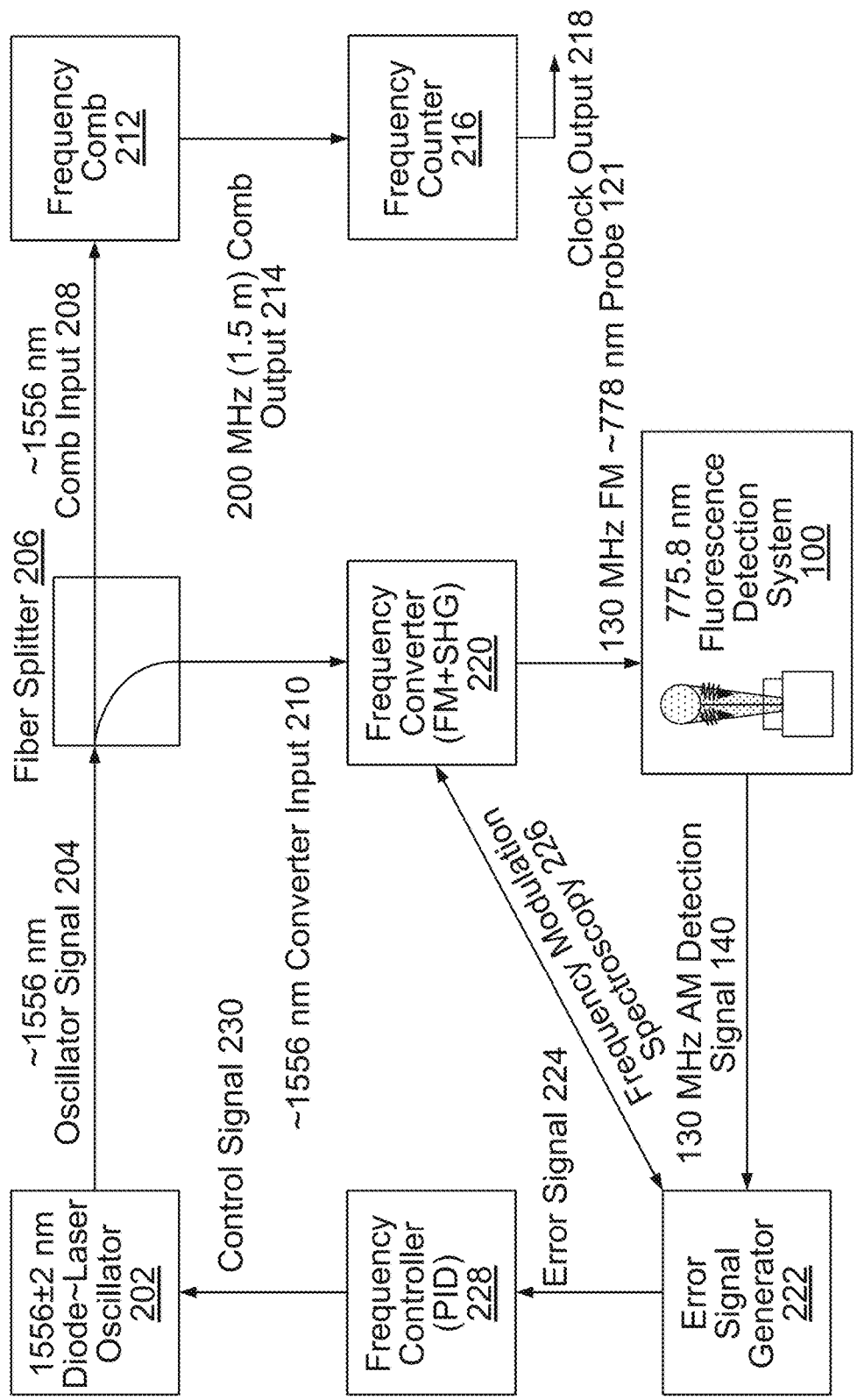
FIG. 2 is a schematic illustration of a rubidium optical atomic clock including the fluorescence detection system of FIG. 1.

Rubidium optical atomic clock 200, shown in FIG. 2, includes an oscillator 202, which is a diode laser that outputs an oscillator signal 204 with 20 milliwatts (mW) of light having wavelength 1556.2±2 nm. This diode laser has a fast linewidth that is significantly below the natural linewidth of the excited clock state ($\Delta v \approx 300$ kHz as observed at 778 nm), alleviating the requirement for laser pre-stabilization to a high finesse optical cavity. In FIG. 2, a tilda "~" is used for signals with frequencies and wavelengths that vary with the oscillator frequency.

A fiber splitter 206 splits oscillator signal 204 into a ~1556 nm comb input 208 and a ~1556 nm converter input 210. Comb input 208, which represents a small portion of oscillator signal 204, is input to an erbium fiber frequency comb 212 to form a beat note. Frequency comb 212 serves to stabilize clock output 218 as long as the wavelength of oscillator signal 204 remains within a target range. Fully self-referenced frequency comb 212 divides the 385 THz comb input 208 to provide a comb output 214 of about 200 megahertz (corresponding to a radio frequency wavelength of 1.5 meters), which is the pulse repetition rate for frequency comb 212. After stabilization of the optical beat note and carrier envelope offset frequency, comb output 214 is photo-detected and input to a frequency counter 216, which can be a Microsemi 5125A, available from Mercury Systems, Inc. Phase noise is compared to a hydrogen maser reference. Frequency counter 216 provides the clock output 218. The following explains how oscillator 202 is regulated so that oscillator 204 remains within that target range.

~1556 nm converter input 210, which represents the larger portion of the output of fiber splitter 206, is input to frequency converter 220. Frequency converter 220 applies 130 kilohertz (kHz) sinusoidal signal to frequency modulate the ~1156 converter input 210 to prepare for frequency modulation spectroscopy (FMS). Frequency converter 210 then frequency doubles the modulated converter input using a second harmonic generator (SHG) to achieve a frequency modulated ~778.1 nm probe signal 121.

The resulting probe signal 121 is input to fluorescence detection system 100, which, as explained above with reference to FIG. 1, outputs fluorescence detection signal 140 in response. The 130 kHz frequency modulation of probe 121 results in a fluorescence detection signal with a 130 kHz amplitude modulation (AM) component. Error-signal generator 222 demodulates fluorescence detection signal 140 to obtain a laser detuning dependent error signal 224, completing the frequency modulation spectroscopy (FMS) 226 of atoms 110 (FIG. 1).

A frequency controller 228 generates a control signal 230 based on error signal 224. Control signal 230 is used to adjust the frequency of oscillator signal 204 to maintain it within the target range for frequency comb 212. Frequency controller 228 is a proportional integral differential (PID) controller that takes past, present and future into account when determining desired frequency corrections. The "present" is taken into account by the present value of the error signal. The "past" is taken into account by an integral over recent values of the error signal. The "future" is based on the present derivative of the error signal. The regulation cycle from oscillator 202 to fluorescence detection system 100 to frequency controller 228 is repeated frequently enough that the wavelength of oscillator signal 204 never deviates outside the target range of wavelengths that frequency comb requires to maintain a stable clock output 208.

Further implementation details for atomic clock 200 can be gleaned from Kyle W. Martin et al. in "Compact Optical Atomic Clock Based on a Two-Photon Transition in Rubidium", arXiv:1903.11231v1 [physics.atom-ph] 27 Mar. 2019, which is incorporated in full herein by reference. Atomic clock 200 differs from the Martin atomic clock in several respects. While Martin detects 420 nm fluorescence and implicitly rejects 775.8 nm fluorescence, atomic clock 200 does the opposite: detecting 775.8 nm fluorescence and rejecting 420 nm fluorescence (although an alternative embodiment detects both wavelengths). Thus, while Martin need only distinguish between wavelengths that are more than 300 nm apart, atomic clock 200 must distinguish between wavelengths only 1 nm to 9 nm apart, or, more specifically, about 2.2 nm apart. Thus, Martin's $^{87}$Rb atoms are in the form of a hot vapor distributed through a vapor cell, the atoms of atomic clock 200 are cooled and then localized in a small volume with a cell to make the most of the narrow effective angle of incidence that characterize the spectral filter used to block 778 nm scatter from 775.8 nm fluorescence.

Figure 3:
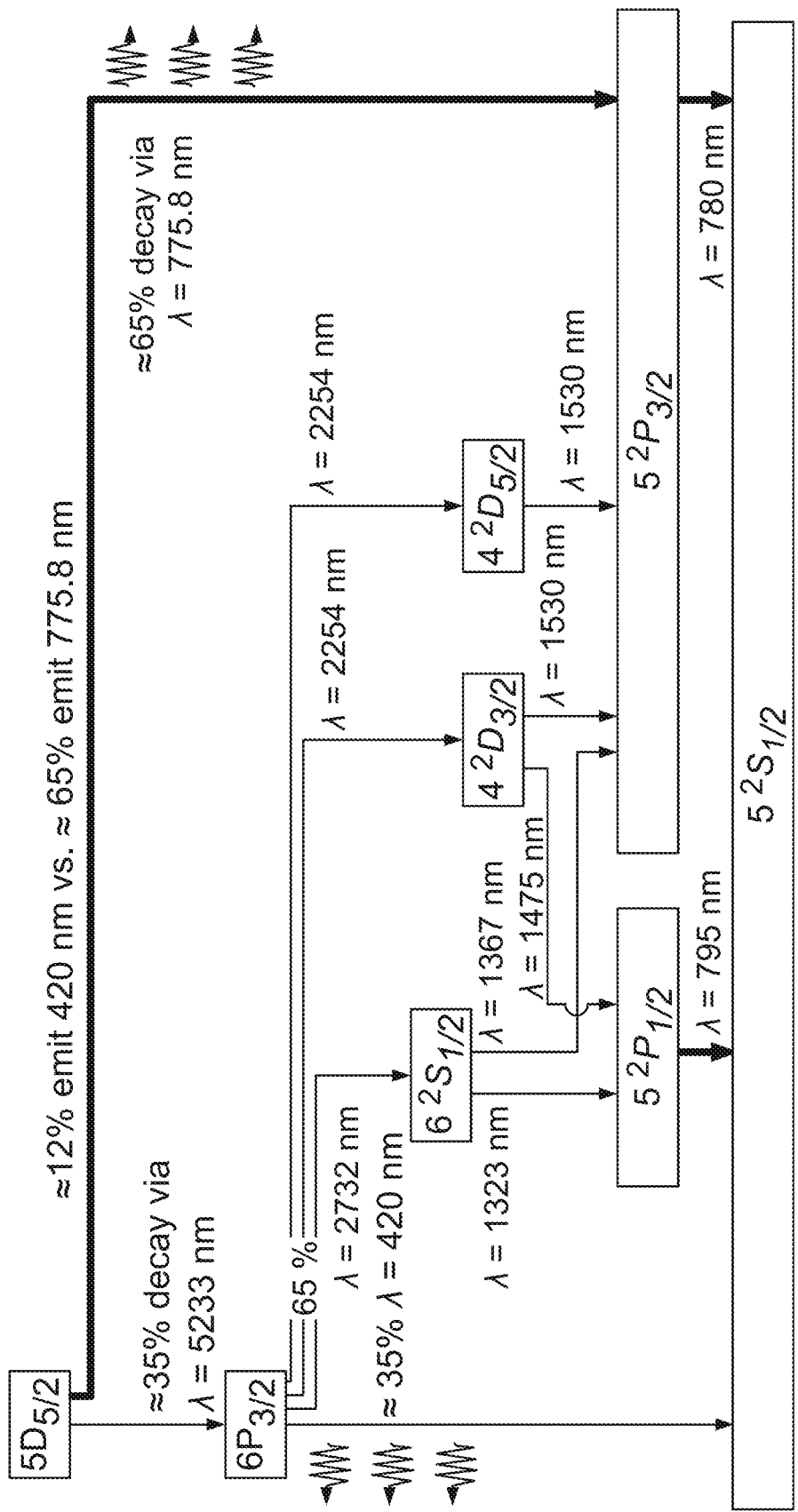
FIG. 3 is a directed graph of rubidium energy levels and transitions therebetween relevant to the fluorescence detection system of FIG. 1.

The advantage of using 775.8 nm fluorescence is apparent from rubidium 87 energy level diagram 300, FIG. 3. Atom clock 200 uses 778 nm light tuned to a monochromatic two-photon transition to excite $^{87}$Rb atoms from a 5 $^2D_{1/2}$ ground state to a $5D_{5/2}$ excited state. About 65% of the excited atoms decay to a 5 $^2P_{3/2}$ intermediate state, emitting 775.8 nm fluorescence in the process. This is the fluorescence detected by fluorescence detection system 100 and atomic clock 200. The remaining about 35% of excited atoms decay to an intermediate $6P_{3/2}$ energy level, and about 35% of these decay from the $6P_{3/2}$ intermediate energy level to the original 5 $^2D_{1/2}$ ground state, emitting 420 nm fluorescence in the process. Since 35%×35%=12.25%, only about 12% of the excited atoms provide this 420 nm fluorescence relied upon by Martin et al. The remaining about 65% of atoms at the intermediate $6P_{3/2}$ energy level decay to the 5 $^2D_{1/2}$ ground state through various other intermediate states. Thus, atomic clock 200 stabilizes its oscillator using detection of fluorescence that is five times stronger than the 420 nm fluorescence relied on by Martin et al.

Figure 4:
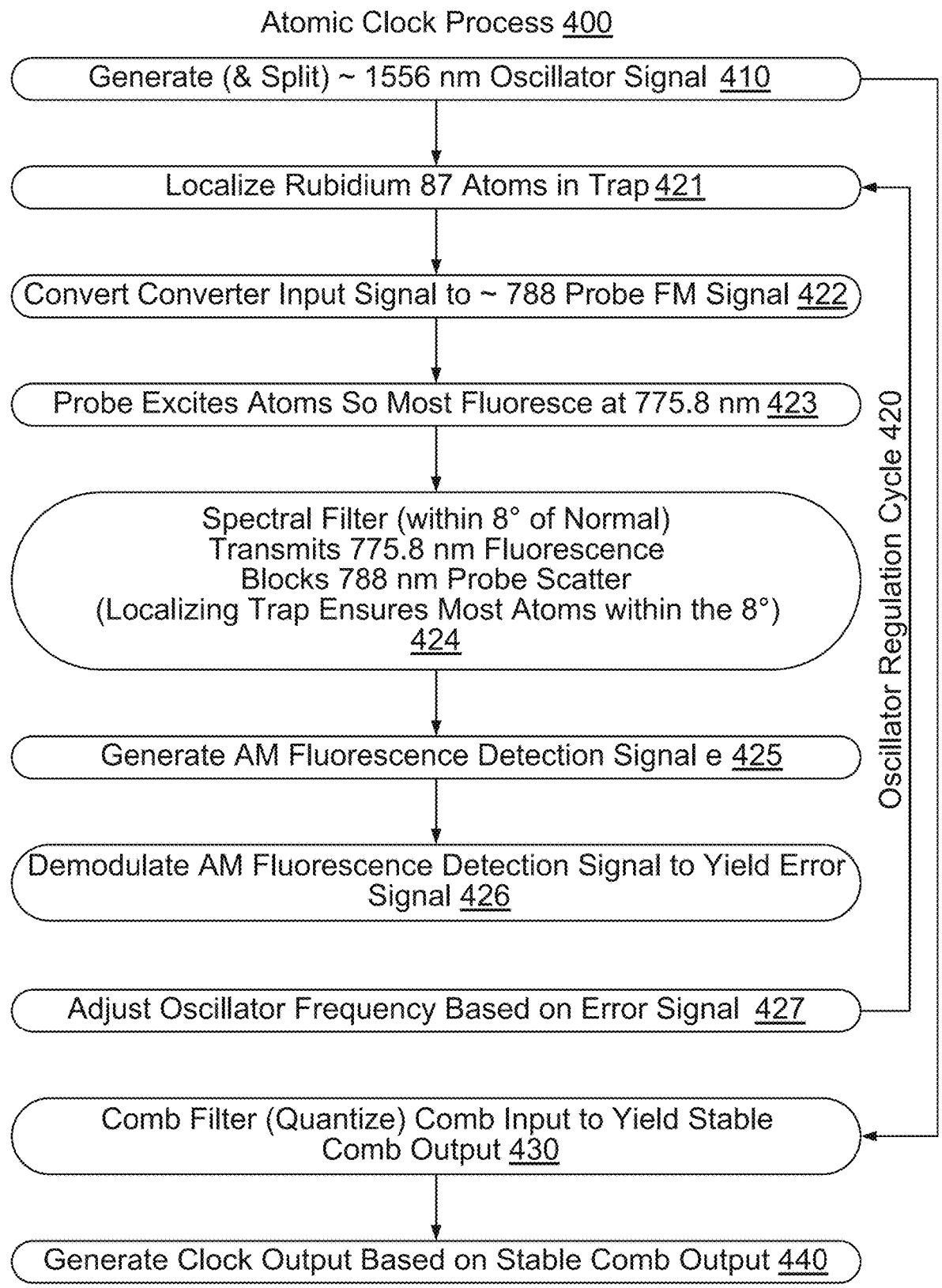
FIG. 4 is a flow chart of an atomic clock process implementable in the atomic clock of FIG. 2 and in other atomic clocks.

An atomic clock process 400, flow-charted at FIG. 4, is implemented by atomic clock 200 and other atomic clocks. At 410, a ~1556 nm signal is generated and split to yield a comb filter input and a frequency converter input. At 420, a frequency regulation cycle is used to regulate the frequency of the oscillator signal so that the comb input remains within a target range required by a frequency comb to provide a stable output. At 430, the frequency comb provides a stable comb output signal. At 440, a stable clock output signal is generated based on the stable comb filter output.

Oscillator regulation cycle 420 includes, at 421, cooling and localizing $^{87}$Rb atoms in a trap occupying a volume that is a fraction (e.g., less than 1/10) of the volume of a hermetically sealed cell containing the atoms. At 422, the converter input is frequency modulated using a 130 kHz sinusoidal signal and then frequency doubled to yield a ~778 nm FM probe signal effectively modulated at 260 kHz. At 423, the probe and a retro-reflected copy of the probe excite the atoms such that most of the excited atoms fluoresce at 775.8 nm.

At 424, a spectral filter transmits 775.8 nm fluorescence while blocking ~788 nm scatter. Commercially available spectral filters can separate these wavelengths, which are only ~2.2 nm apart, provided the wavelength to be transmitted is perpendicular (i.e., "normal") to the filter or at least within an effective angle of incidence relative to the normal. In atomic clock 200, the effective angle for the wavelengths involved is 8°. Accordingly, the localization of atoms at 422 is such that most of the atoms are within a conical volume defined by the 8° effective angle of incidence to ensure effective separation of the 775.8 nm fluorescence from the ~778 nm probe scatter.

The transmitted 775.8 nm fluorescence is collected by a fluorescence detector, which outputs a fluorescence detection signal, at 425. Due to the 260 kHz frequency modulation (FM) of the probe signal, the fluorescence detection signal is characterized by a 130 kHz amplitude modulation (AM). At 426 an error-signal generator demodulates the fluorescence detection signal to yield an error signal that indicates deviations in the oscillator signal from its expected frequency. At 427, a frequency controller adjusts as necessary the frequency of the oscillator signal based on the error signal to maintain the oscillator signal well within the target frequency range of the frequency comb. Oscillator regulation cycle 420 is repeated as often or more often than necessary to ensure a stable comb output and thus a stable atomic clock output is based at 440. Note that actions 421, 423, 424, and 425 constitute a fluorescence detection process with or without the frequency modulation and demodulation.

Fluorescence detection system 100 excites rubidium 87 atoms as sources of fluorescence. Other embodiments use other isotopes of rubidium, other alkali atoms, alkaline metal earth atoms, other atoms, and other molecular entities, e.g., fluorescent molecules. Herein, a "molecular entity" is "any constitutionally or isotopically distinct atom, molecule, ion, ion pair, radical, radical ion, complex, conformer, etc., identifiable as a separately distinguishable entity". The molecular entities of interest herein are those that can assume superpositions of energy levels in response to probe beams and from which they can decay so as to release fluorescence.

Some embodiments use two or more fluorescent species. Fluorescence detection system 100 uses a magneto-optical trap to localize atoms within a cell. Alternative embodiments use optical lattices, other all-optical traps, and other traps to localize the molecular entities. Fluorescence detection system 100 uses monochromatic 2-photon excitation in which two steps of the transition are interrogated by respective probe photons of the same wavelength. Other embodiments use n-photon transitions, where n is a positive integer. In some embodiments, all probe wavelengths used are the same, while other embodiments employ probes of different wavelengths.

In various embodiments, frequency modulation spectroscopy can be implemented by frequency modulating a converter input with a sub-1 megahertz (MHz) modulation signal in the process of producing a probe signal and demodulating a resulting fluorescence detection signal by a like frequency. In various embodiments, the probe wavelength can match the oscillator wavelength or can be derived from the oscillator wavelength in various ways. Depending on the embodiment, the spectral filter can be a low frequency pass filter (as used by Martin et al.), a high-frequency pass filter, a notch filter, a bandpass filter, or a combination of these filter types.

Herein, all art labeled "prior art", if any, is admitted prior art; art not labeled "prior art" is not admitted prior art. The illustrated embodiments, variations thereupon, and modifications thereto are provided for by the present invention, the scope of which is defined by the accompanying claims.

What is claimed is:

1. An atomic clock process comprising:
    a) generating and splitting an oscillator signal having an oscillator frequency to yield a comb input signal and a converter input signal;
    b) localizing molecular entities within an optical trap;
    c) converting the converter input signal into a first probe beam having a first probe wavelength;
    d) exciting the molecular entities using the first probe beam so that the molecular entities fluoresce at a first fluorescence wavelength;
    e) using a spectral filter, filtering a fluorescence of the first fluorescence wavelength so as to transmit the fluorescence of the first fluorescence wavelength while blocking light of the first probe wavelength;
    f) collecting filtered fluorescence of the first fluorescence wavelength to yield a fluorescence detection signal;
    g) adjusting the oscillator frequency based on the fluorescence detection signal;
    i) comb filter the comb input signal to yield a stable comb output; and
    j) generate a stable clock output based on the stable comb output.

2. The atomic clock process of claim 1 further comprising iterating actions b-g to constrain the oscillator frequency to a range that results in a stable comb output.

3. The atomic clock process of claim 1 wherein the exciting includes passing the first probe beam through the optical trap, reflecting the passed-through first probe beam to yield a second probe beam having the first probe wavelength so that, collectively, the first probe beams transition the molecular entities from a ground state to an excited state using a monochromatic two-photon transition.

4. The atomic clock process of claim 1 wherein the adjusting includes deriving an error signal from the fluorescence detection signal, calculating a desired oscillator frequency correction based on the error signal, and controlling an oscillator to implement the desired frequency correction.

5. The atomic clock process of claim 1 wherein the spectral filter is characterized by an effective angle of incidence on the spectral filter within which the spectral filter can effectively block the first probe wavelength and transmit the first fluorescence wavelength, the spectral filter being less effective at blocking the first probe wavelength or transmitting the first fluorescence wavelength at angles of incidence larger than the effective angle of incidence.

6. The atomic clock process of claim 5 wherein at least half of the localized molecular entities are within a conical volume defined by the effective angle of incidence.

7. The atomic clock process of claim 5 wherein, in the absence of the optical trap, the molecular entities would be distributed so that fewer than half of the molecular entities would be within a conical volume defined by the effective angle of incidence.

8. The atomic clock process of claim 5 wherein the effective angle of incidence is within two degrees of 8°.

9. The atomic clock process of claim 1 wherein the converting includes:

frequency modulating the converter input signal with a sinusoidal signal of modulator frequency below 1 megahertz (1 MHz); and demodulating the fluorescence detection signal by the modulator frequency.

10. The atomic clock process of claim 1 wherein the molecular entities include rubidium 87 atoms, the oscillator frequency is 1556±1 nanometer (nm), the first probe wavelength is 778±0.5 nm, and the first fluorescence wavelength is 775.8±0.5 nm.

11. An atomic clock comprising:
an oscillator for generating an oscillator signal having an oscillator frequency;
a beam splitter for splitting the oscillator signal into a comb input signal and a converter input signal;
a frequency comb for providing a stable comb output based on a comb input that remains within a target comb frequency range;
a counter for generating a stable clock output signal based on the stable comb output;
an atom trap generator for cooling and localizing molecular entities in an optical trap;
a frequency converter for converting the converter input signal into a first probe beam for probing the molecular entities so as to transition the localized molecular entities from a ground state to an excited state from which they can decay back to the ground state so as to emit fluorescence of a first fluorescence wavelength, the first probe beam having a first probe wavelength;
a spectral filter for filtering the fluorescence of the first fluorescence wavelength so as to transmit the fluorescence of the first fluorescence wavelength while blocking light of the first probe wavelength;
a fluorescence detector for collecting filtered fluorescence of the first fluorescence wavelength, the fluorescence detector providing a fluorescence detection signal; and
a frequency controller for adjusting the oscillator frequency based on the fluorescence detection signal so that the comb input signal remains within the target comb frequency range.

12. The atomic clock of claim 11 wherein the molecular entities include rubidium 87 atoms, the oscillator frequency is 1556±1 nanometer (nm), the first probe wavelength is 778±0.5 nm, and the first fluorescence wavelength is 775±0.5 nm.

13. The atomic clock of claim 11 wherein the first probe beam passes through the optical trap and reflects to yield a second probe beam having the first probe wavelength such that, collectively, the first probe beams transition the molecular entities from the ground state to the excited state using a monochromatic two-photon transition.

14. The atomic clock of claim 11 further comprising an error-signal generator for deriving an error signal from the fluorescence detection signal, the frequency controller adjusting the oscillator frequency based on the error signal.

15. The atomic clock of claim 14 wherein:
the frequency converter modulates the converter input using a sinusoidal signal having a modulation frequency less than 1 megahertz; and
the error-signal generator demodulates the fluorescence detection signal using the same modulation frequency.

16. The atomic clock of claim 11 wherein the spectral filter is characterized by an effective angle of incidence on the spectral filter within which the spectral filter can effectively block the first probe wavelength and transmit a second wavelength, the spectral filter being less effective at blocking the first probe wavelength or transmitting the first fluorescence wavelength at larger angles of incidence.

17. The atomic clock of claim 16 wherein at least half of the localized molecular entities are within a conical volume defined by the effective angle of incidence.

18. The atomic clock of claim 16 wherein, in the absence of the optical trap, the molecular entities would be distributed throughout a cell so that fewer than half of the molecular entities would be within a conical volume.

19. The atomic clock of claim 16 wherein the effective angle of incidence is within two degrees of 8°.

* * * * *